US006387444B1

United States Patent
Okada et al.

(10) Patent No.: US 6,387,444 B1
(45) Date of Patent: May 14, 2002

(54) SINGLE SUBSTRATE PROCESSING CVD PROCEDURE FOR DEPOSITING A METAL FILM USING FIRST AND SECOND CVD PROCESSES IN FIRST AND SECOND PROCESS CHAMBERS

(75) Inventors: Osamu Okada, Kanagawa-ken; Atsushi Sekiguchi, Tokyo, both of (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/511,698

(22) Filed: Feb. 23, 2000

Related U.S. Application Data

(62) Division of application No. 09/227,089, filed on Jan. 5, 1999, now abandoned.

(30) Foreign Application Priority Data

Mar. 20, 1998 (JP) .............................................. 10-92399

(51) Int. Cl.[7] .......................... C23C 16/06; C23C 16/18; C23C 16/52
(52) U.S. Cl. ..................... 427/250; 427/255.7; 427/404; 438/687; 438/680; 438/681
(58) Field of Search ................................. 427/99, 248.1, 427/250, 255.28, 255.31, 497, 569, 576, 255.15, 255.7, 404, 405; 118/715; 438/687, 584, 618, 638, 681

(56) References Cited

U.S. PATENT DOCUMENTS

| | | | | | |
|---|---|---|---|---|---|
| 4,855,804 A | * | 8/1989 | Bergami et al. | ............. | 438/643 |
| 5,096,737 A | * | 3/1992 | Baum et al. | ................... | 427/38 |
| 5,298,458 A | * | 3/1994 | Mieno et al. | ............... | 437/187 |
| 5,322,712 A | * | 6/1994 | Norman et al. | .............. | 427/250 |
| 5,354,712 A | * | 10/1994 | Ho et al. | ..................... | 438/643 |
| 5,358,743 A | * | 10/1994 | Hampden-Smith | .......... | 427/282 |
| 5,407,698 A | * | 4/1995 | Emesh | .......................... | 427/99 |
| 5,798,569 A | * | 8/1998 | Miyazaki et al. | ........... | 257/763 |
| 5,814,153 A | * | 9/1998 | Ishikawa | ..................... | 118/719 |
| 6,017,396 A | * | 1/2000 | Okamoto | ..................... | 118/719 |
| 6,030,893 A | * | 2/2000 | Lo et al. | ..................... | 438/652 |
| RE36,623 E | * | 3/2000 | Wang et al. | ................. | 427/579 |
| 6,065,424 A | * | 5/2000 | Shacham-Diamand et al. | ........................... | 118/696 |
| 6,127,730 A | * | 10/2000 | Smith | ......................... | 257/750 |
| 6,140,228 A | * | 10/2000 | Shan et al. | ................. | 438/653 |

OTHER PUBLICATIONS

Deposition Rate and Gap Filling Characteristics in Cu Chemical Vapor Deposition with Trimethylvinylsilyl Hexafluoro–acetylacetonate Copper(I); Japan J. Appln. Phys. vol. 37 (1998); pp. 6358–6363.*

* cited by examiner

*Primary Examiner*—Shrive P. Beck
*Assistant Examiner*—Wesley Markham
(74) *Attorney, Agent, or Firm*—Burns, Doane, Swecker & Mathis, LLP

(57) ABSTRACT

In the field of depositing a metal film for wiring purposes on a substrate by means of single-substrate processing CVD, a procedure for depositing a copper film on a substrate is carried out by utilizing a first CVD module in which film deposition is carried out under first film deposition conditions where the film deposition rate is low and the filling characteristics are good, and a second CVD module in which film deposition is carried out under second film deposition conditions where the film deposition rate is high and the filling characteristics are poor. One CVD film deposition process in which a metal film for wiring purposes is deposited is carried out with sub-processes based on two different sets of film deposition conditions.

8 Claims, 4 Drawing Sheets

18: Transferring robot
19: Silicon substrate

SINGLE SUBSTRATE PROCESSING CVD PROCEDURE FOR DEPOSITING A METAL FILM USING FIRST AND SECOND CVD PROCESSES IN FIRST AND SECOND PROCESS CHAMBERS

This application is a divisional, of Application Ser. No. 09/227,089, filed Jan. 5, 1999, now abandoned.

BACKGROUND OF THE INVENTION

1. Field of the Invention

The invention concerns a single-substrate processing CVD apparatus and a single-substrate processing CVD procedure and, in particular, it concerns a single-substrate processing CVD apparatus and a single-substrate processing CVD procedure whereby a metal film for wiring purposes is deposited using a plurality of CVD film deposition modules in order to form a highly integrated circuit device on a silicon or glass substrate.

2. Description of Related Art

Only experimental copper CVD (chemical vapor growth or chemical vapor deposition) apparatus for depositing copper films for wiring purposes of semiconductor highly integrated circuit devices have been made in the past, and a single-substrate processing copper CVD apparatus for volume manufacture has not as yet been provided successfully. A copper film for wiring purposes is to be deposited on a silicon, compound semiconductor or glass substrate in a single-substrate processing copper CVD apparatus for volume manufacture purposes. There is a need (a) to increase the rate of deposition of the film and raise the film deposition efficiency and (b) to improve the filling characteristics for step coverage and to improve the quality of the film in the single-substrate processing copper CVD apparatus for volume manufacture purposes.

Much research has been carried out in the past in connection with the process order of the optimum film deposition process in single-substrate processing copper CVD apparatus, the number of processes, and the number of film deposition modules and their construction from the viewpoints of achieving a higher film deposition efficiency and higher film quality. However, as yet no ideal film deposition module for single-substrate processing copper CVD apparatus for volume manufacture purposes has been verified Thus if, in the case of copper CVD, a copper film is deposited in a single process (with one set of film deposition conditions in one film depositing chamber) then there is a trade-off between the film deposition rate and the filling characteristics of the film. It is very difficult to carry out film deposition in such a way as to provide a satisfactory film deposition rate and satisfactory filling characteristics with single process copper CVD. Up to the present time no practical single-substrate processing copper CVD apparatus for volume manufacture purposes has been realized.

OBJECTS AND SUMMARY

An aim of the present invention is to resolve the problems described above and to provide a single-substrate processing CVD apparatus and a single-substrate processing CVD procedure whereby a high film deposition rate and good filling characteristics can be realized and with which both the film deposition efficiency and the film quality are improved in a single-substrate processing CVD apparatus where a metal film for wiring purposes is being deposited on a substrate.

The single-substrate processing CVD apparatus and the single-substrate processing CVD procedure of the present invention are constituted in the ways indicated below for realizing the aforementioned aims.

The single-substrate processing CVD apparatus of the present invention is a cluster-tool type apparatus is (multi-chamber type apparatus) with which a metal film for wiring purposes is deposited on a substrate. The single-substrate processing CVD apparatus is furnished with a first CVD module in which film deposition is carried out under first deposition conditions where the film deposition rate is relatively low and the filling characteristics are good and a second CVD module in which film deposition is carried out under second deposition conditions where the film deposition rate is relatively high and the filling characteristics are poor.

In the CVD apparatus of the present invention, use is made of the fact that when the film deposition temperature (substrate temperature) is set relatively low (first deposition conditions), the rate of film deposition is relatively low and the filling characteristics for step coverage are relatively good. Moreover, in the CVD apparatus of the present invention, use is made of the fact that when the aforementioned film deposition temperature (substrate temperature) is set relatively high (second deposition conditions), the rate of film deposition is relatively high and the embedding characteristics for step coverage are not as good as with the first deposition conditions. The system is such that one CVD process for depositing a metal film for wiring purposes is divided into sub-processes on the basis of two sets of film deposition conditions, and the sub-processes are carried out in first and second CVD module respectively. Hence, the single-substrate processing CVD apparatus of the present invention is suitable for the volume manufacture of semiconductor wafer fabrication equipment with which an increase in film deposition efficiency and improvement in film quality can be realized.

One film deposition procedure is completed by combining a film deposition process which is carried out under first film deposition conditions and a film deposition process which is carried out under second film deposition conditions. The CVD apparatus of this invention has at least two CVD modules corresponding to each set of film deposition conditions.

The first CVD module and the second CVD module are both thermal CVD modules. The precursor used in the first CVD module and the second CVD module is preferably a β-diketonato-copper(I) complex. Trimethylvinylsilyl-hexafluoroacetylacetonato-copper(I) can be used for the precursor β-diketonato-copper(I) complex. Under the first film deposition conditions, the substrate temperature is preferably set to a temperature within the range of about 150 to 190° C. and under the second film deposition conditions, the substrate temperature is preferably set to a temperature within the range of about 190 to 230° C. The difference between the substrate temperatures under the first and second film deposition conditions is preferably at least 5° C.

Another single-substrate processing CVD procedure of the present invention is a procedure whereby a metal film for wiring purposes is deposited on a substrate by means of a combination of a first CVD process and a second CVD process, which have different film deposition conditions as one film deposition process. In the first CVD process a film is deposited under first film deposition conditions where the film deposition rate is relatively low and the filling characteristics are good. In the second CVD process a film is deposited under second film deposition conditions where the film deposition rate is relatively high and the filling characteristics are not as good as the first film deposition conditions. In the CVD procedure of the present invention, the first CVD process and the second CVD process are executed sequentially. The order in which the first CVD process and the second CVD process are carried out is determined in accordance with the form of the wiring pattern for which the film deposition process is being carried out. When the form of the wiring pattern is relatively small, the first CVD process is carried out first and then the second CVD process is carried out. When the form of the wiring pattern is relatively large, the second CVD process is carried out first and then the first CVD process is carried out.

The first and second CVD processes are both thermal CVD processes. The precursor used in the first CVD process and the second CVD process is preferably a β-diketonato-copper(I) complex. Trimethylvinylsilyl-hexafluoroacetylacetonato-copper(I) can be used for the precursor β-diketonato-copper(I) complex. Under the first film deposition conditions, the substrate temperature is preferably set to a temperature within the range of about 150 to 190° C. and under the second film deposition conditions, the substrate temperature is preferably set to a temperature within the range of about 190 to 230° C. The difference between the substrate temperatures under the first and second film deposition conditions is at least 5° C.

DETAILED DESCRIPTION OF THE PREFERRED EMBODIMENTS

Figure 1:
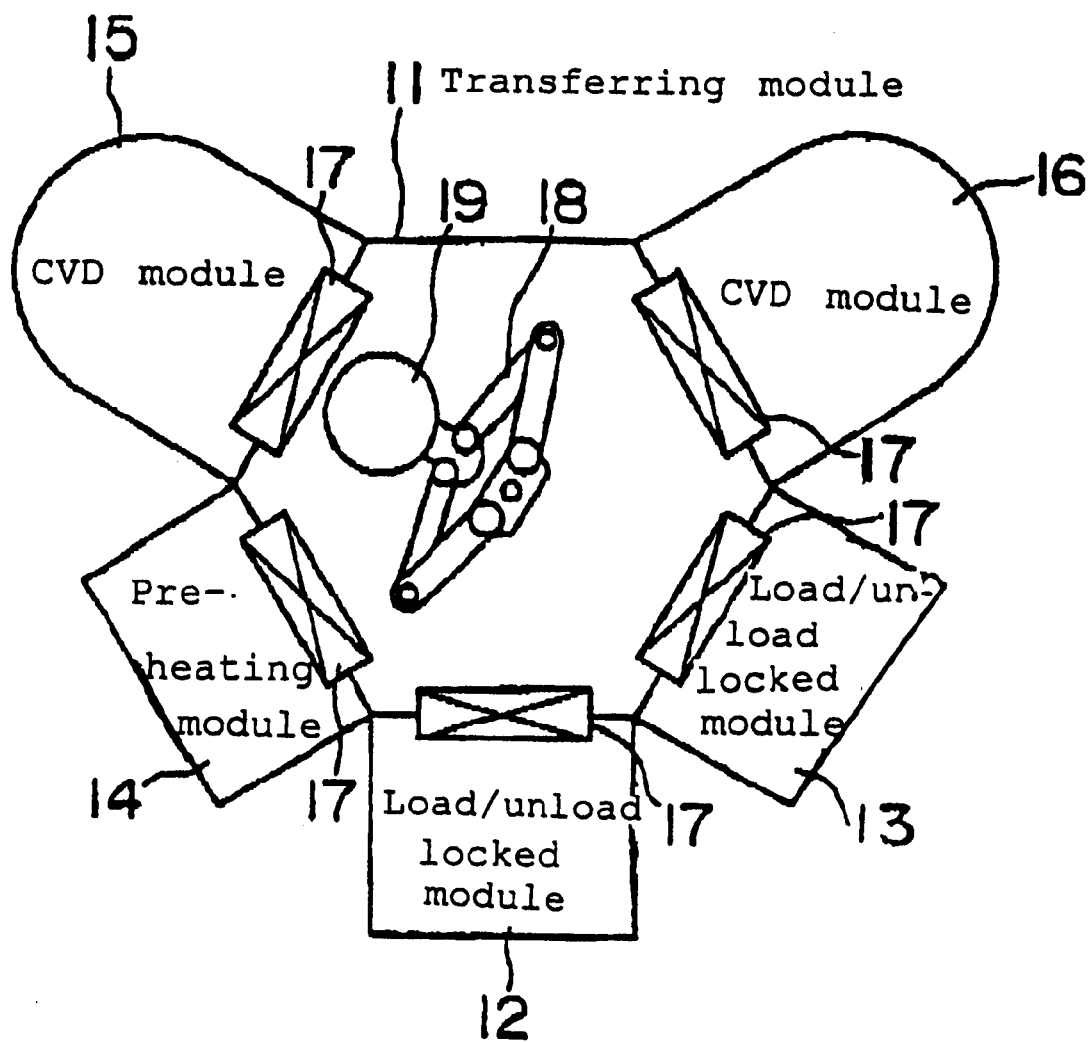
FIG. 1 is a plan view which shows a first embodiment of a single-substrate processing CVD apparatus of this invention.

A first preferred embodiment of a single-substrate processing CVD apparatus of this invention is shown in FIG. 1. FIG. 1 is a drawing, as seen from above, of a cluster-tool type CVD system which is furnished with a plurality of modules 12 to 16 around a central transferring module 11. The gate valves 17 are established between the transferring module 11 and each of the modules 12 to 16. A frog-leg type transferring robot 18 is established in the transferring module 11. The transferring robot 18 transfers a silicon substrate 19 into or out of each of the modules with its hand. The plurality of modules disposed around the transferring module 11 comprises two load/unload locked modules 12 and 13, a pre-heating module 14, a first CVD module 15 and a second CVD module 16. Film deposition is carried out by thermal CVD in the CVD modules 15 and 16. In the CVD modules 15 and 16 a copper film for wiring purposes is deposited on a wiring pattern (wiring structure) which has been formed on the surface of the silicon substrate 19. Ideally the CVD modules 15 and 16 are furnished with the CVD hardware disclosed in U.S. patent application Ser. No. 08/905,166 (date of application: Aug. 4th 1997, title of the invention: "Chemical Vapor Deposition Apparatus"). Deposition of the copper film is carried out under first film deposition conditions where the film deposition rate is relatively low and the filling characteristics are good in the first CVD module 15. The first film deposition conditions are realized by setting the film deposition temperature to a relatively low value. Deposition of the copper film is carried out under second film deposition conditions where the film deposition rate is relatively high and the filling characteristics are not as good as in the first film deposition conditions in the second CVD module 16. The second film deposition conditions are realized by setting the film deposition temperature to a relatively high value. The film deposition temperature is determined essentially by the substrate temperature. As mentioned above, the film is deposited by means of thermal CVD, but film deposition is not limited to this technique. Other types of CVD where the film deposition conditions can be set differently can also be used.

In the CVD apparatus, a single silicon substrate 19, which has been set in a cassette (not shown in the drawing), is introduced via one load/unload locked module 12 into the pre-heating module 14 by means of the transferring robot 18. The silicon substrate 19 is heated to about 175° C. in the pre-heating module 14. Subsequently, the silicon substrate 19 is transferred into the CVD module 15 by means of the transferring robot 18. The precursor for the deposition of a copper film is trimethylvinylsilyl-hexafluoroacetylacetonato-copper(I). The film deposition temperature in the CVD module 15 is preferably set to 175° C. Copper film deposition on the silicon substrate 19 is carried out for 2 minutes and 30 seconds in the CVD module 15. After depositing this film, the silicon substrate 19 is transferred from the CVD module 15 to the CVD module 16 by means of the transferring robot 18. The film deposition temperature in the CVD module 16 is preferably set to 210° C. Copper film deposition on the silicon substrate 19 is carried out for 2 minutes and 30 seconds in the CVD module 16. After depositing this film, the silicon substrate 19 is transferred from the CVD module 16 and returned to the load/unload locked module 12 by means of the transferring robot 18.

Figure 2:
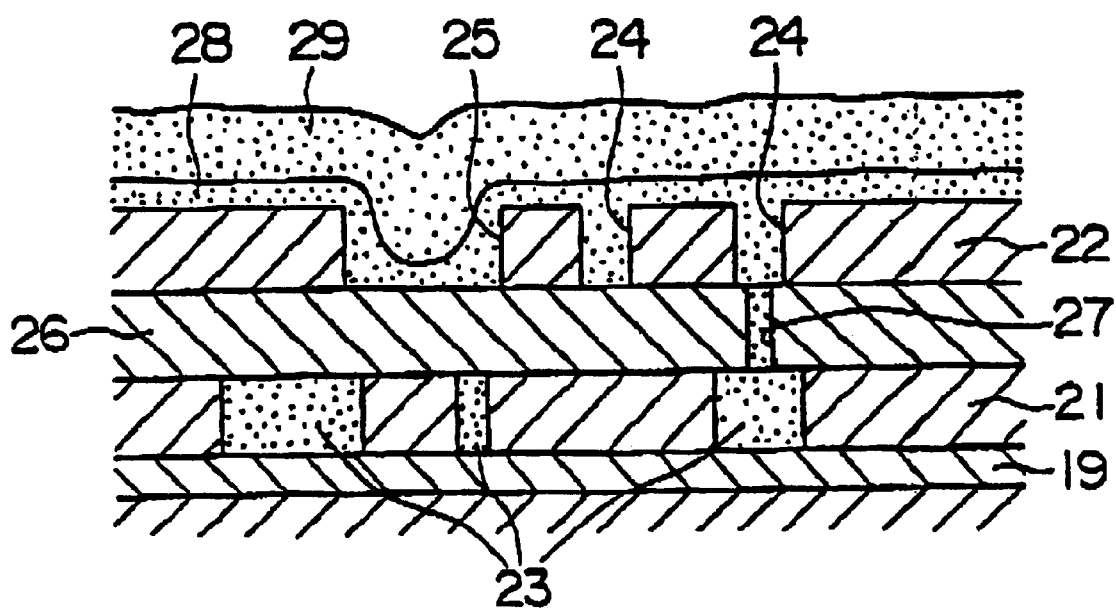
FIG. 2 is a cross sectional drawing which shows the wiring structure and the state of film deposition in the first embodiment.

The wiring structure on depositing the copper film is shown in FIG. 2. In FIG. 2, reference numbers 21 and 22 indicate pattern layers for wiring formation purposes which have been laminated on the silicon substrate 19. Moreover, reference number 23 is wiring (copper) which has been formed on the under-side, and reference numbers 24 and 25 are wiring trenches (grooves) which have been formed in the pattern layer 21 on the top side. The wiring trench 24 is a narrow trench and the wiring trench 25 is a wide trench. An insulating layer 26 has been formed between the pattern layers 21 and 22 and the via hole 27 has been formed in the insulating layer 26. CVD apparatus of the embodiment described above was used to form the wiring on the upper pattern layer 22. The lower copper film 28 on the upper pattern layer 22 was deposited by means of the CVD module 15. The upper copper film 29 was deposited by means of the CVD module 16. The copper wiring 23 formed on the under-side was connected electrically with the copper film which formed the wiring on the upper side by means of the copper which was deposited in the via hole 27.

The wiring structure shown in FIG. 2 is described in more detail below. Thus, the abovementioned wide trench 25 of width 1.5 μm (microns) and depth 0.5 μm, the abovementioned narrow trench 24 of width 0.3 μm and depth 0.5 μm and the abovementioned fine via hole 27 of diameter 0.2 μm and depth 0.5 μm are present in the pattern layer 22 for forming the wiring structure.

Deposition of a copper film 28 of thickness 200 nm (nanometers) is carried out on the basis of the aforementioned first film deposition conditions in the CVD module 15 with the aforementioned CVD apparatus. The first film deposition conditions, under which the filling characteristics are good, are set in the CVD module 15 and so via holes of diameter 0.3 μm, or below, and wiring trenches of width 0.35 μm, or below, are filled completely with copper film at this time. Hence, the fine via hole 27 and the narrow trench 24 are filled completely, as shown in FIG. 2. On the other hand, 200 nm conformal deposition occurs at this stage in the wide trench 25, and the filling with the copper film 28 is incomplete in the wide trench 25.

Deposition of the copper film 29 of thickness 400 nm is then carried out on the basis of the abovementioned second film deposition conditions in the CVD module 16. By this means, the wide trench 25 is completely filled with copper.

If the film deposition process is carried out under single film deposition conditions and copper is deposited on a wiring pattern in which fine via holes, narrow trenches and wide trenches are present then filling is achieved in the CVD module with film deposition conditions, with which the filling characteristics are good. However, under these film deposition conditions, the film deposition rate is low and so a long film deposition time of 7 minutes and 30 seconds is required to deposit a film of depth (trench depth 0.5 μm)+ (thickness of deposited film to ensure a margin for filling: 0.1 μm)=0.6 μm. On the other hand, if deposition is carried out under just the film deposition conditions of the other CVD module 16 then filling failure where voids are formed in the fine via holes and narrow trenches occurs.

Complete and high-speed copper film filling for a wiring pattern in which fine holes, narrow trenches and wide trenches are present can be achieved by using CVD apparatus which is furnished with the CVD modules 15 and 16 in accordance with this embodiment.

Figure 3:
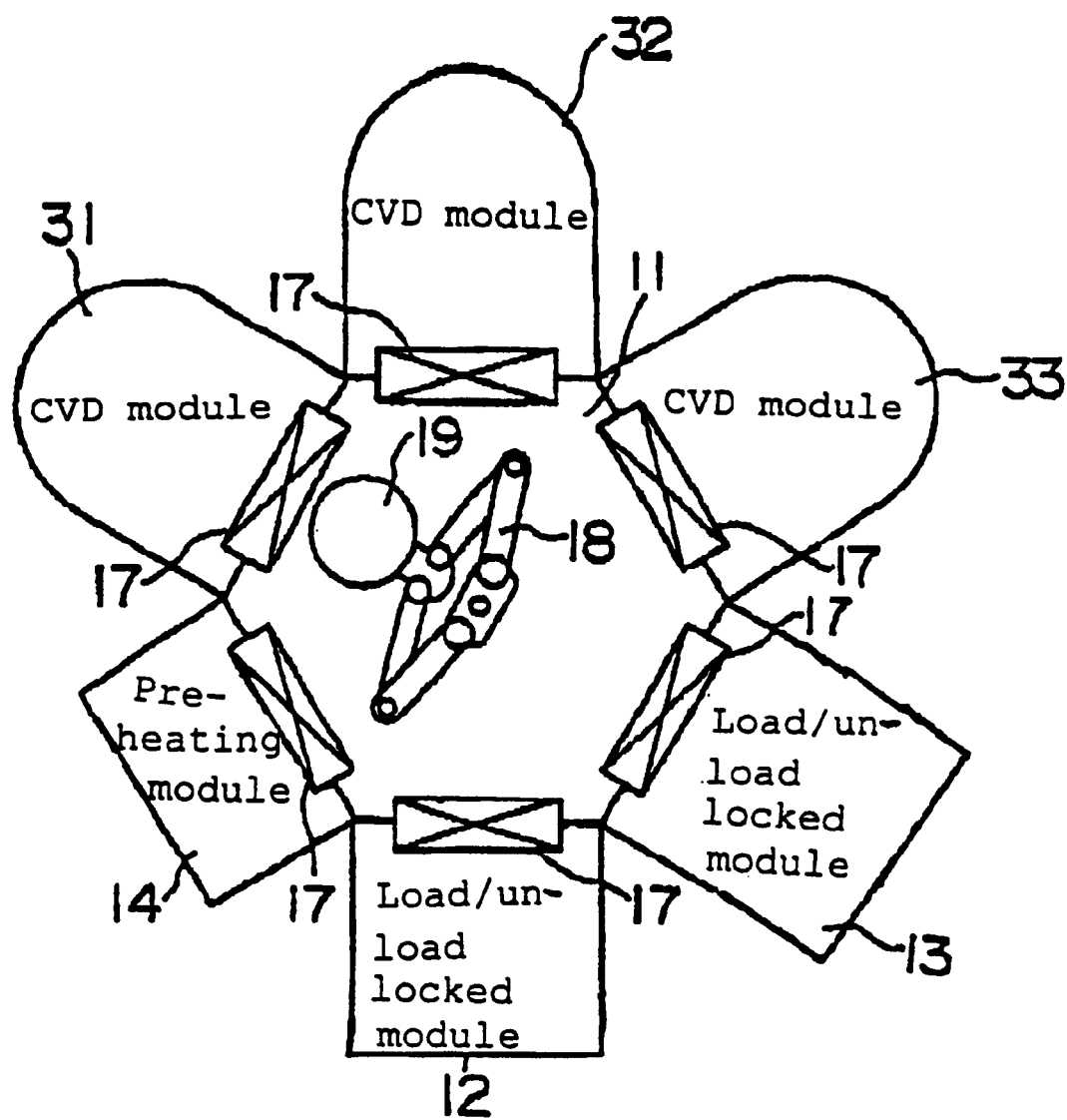
FIG. 3 is a plan view which shows a second embodiment of single-substrate processing CVD apparatus of this invention.

A second embodiment of a single-substrate processing CVD apparatus according to this invention is described below with reference to FIG. 3. In this CVD apparatus there are three CVD modules 31, 32 and 33. The film deposition temperature is set to 210° C. in the CVD modules 31 and 32. The film deposition temperature is set to 175° C. in the CVD module 33. The CVD modules 31 and 32 are essentially the same as the CVD module 16 described above. The CVD module 33 is essentially the same as the CVD module 15 described above. Film deposition with the CVD apparatus of this embodiment is carried out continuously for 2 minutes and 15 seconds in each of the CVD modules 31 and 32 and then film deposition is carried out continuously for 2 minutes and 15 seconds in the CVD module 33. The remainder of the construction of this CVD apparatus is the same as the CVD apparatus described as the first embodiment, and similar elements in FIG. 4 are indicated using the same reference numbers, except that they are distinguished with a prime (') mark.

Figure 4:
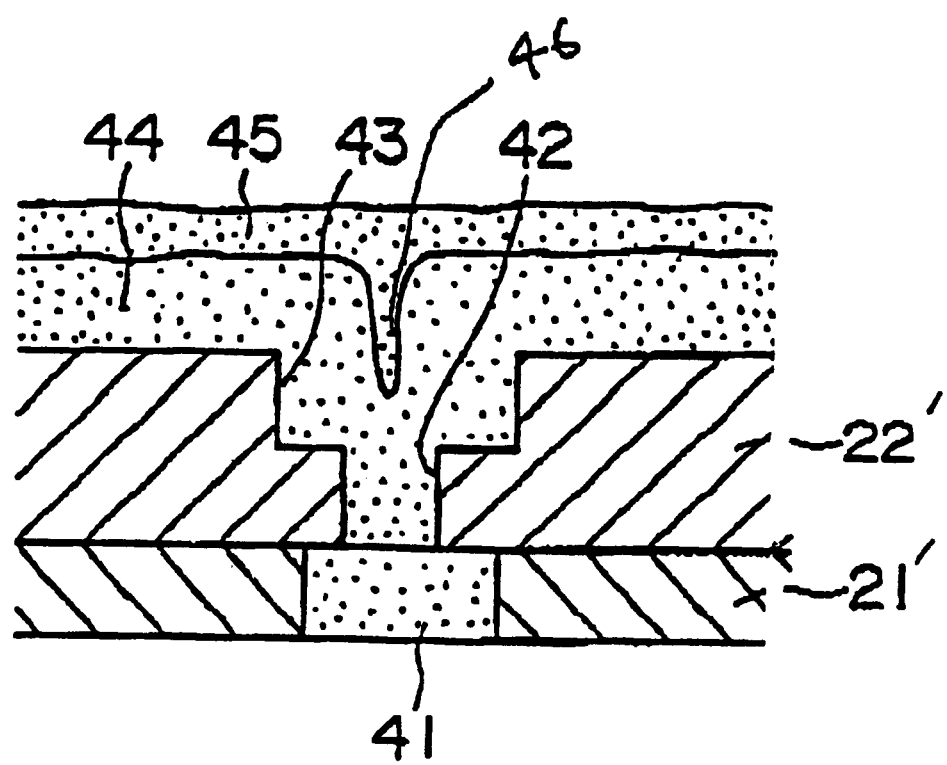
FIG. 4 is a cross sectional drawing which shows the wiring structure and the state of film deposition in the second embodiment.

The wiring structure in the case where a copper film for wiring purposes is deposited with the CVD apparatus of this embodiment is shown in FIG. 4. In FIG. 4, reference number 41 is the under-side wiring, reference number 42 is a via hole and reference number 43 is a wiring trench on the upper side. Moreover reference numbers 21' and 22' are pattern layers for wiring formation purposes, reference number 44 is a copper film which has been deposited by means of the CVD modules 31 and 32, and reference number 45 is a copper film which has been deposited by means of the CVD module 33.

In the second embodiment, the diameter of the smallest via hole 42 is 1 μm and the depth is 1 μm. The width of the wiring trench 43 is more than 1.2 μm and the depth is 1 μm. In the case of this wiring structure the aspect ratio is small and so a film deposition temperature of 210° C. can be used. Deposition of the copper film 44, filling the smallest via hole 42 with copper, is carried out initially in the CVD modules 31 and 32. As shown in FIG. 4, a large void 46 which has a large aspect ratio remains in the copper film 44 after depositing the copper by means of the CVD modules 31 and 32. The copper film 45 is deposited, filling the void 46 with copper, by CVD film deposition at a deposition temperature of 175° C. in the CVD module 33.

Film deposition temperatures of 175° C. and 210° C. have been indicated as the two film deposition conditions in each of the embodiments described above, but the film deposition temperatures are not limited to these values. The combination of film deposition conditions which provide excellent filling characteristics and film deposition conditions which provide an excellent film deposition rate, and the order of film deposition, can be set appropriately in accordance with the form of the wiring structure (the pattern for wiring purposes) comprising wiring trenches and via holes. The substrate is not limited to being a silicon substrate, and it may be a compound semiconductor substrate or a glass substrate. Moreover, the metal film for wiring purposes is not limited to being a copper film and it may be comprised of some other metal.

When trimethylvinylsilyl-hexafluoroacetylacetonato-copper(I) is used for the precursor, as in the embodiments described above, the substrate temperature is preferably set to a temperature within the range from at least about 150° C. to about 190° C. as a film deposition condition which provides good filling characteristics, and the substrate temperature is preferably set to a temperature within the range from at least 190° C. to about 230° C. as a film deposition condition which provides an excellent film deposition rate. Moreover, the difference between the substrate temperatures in the two sets of film deposition conditions is preferably set to at least 5° C.

It is clear from the description outlined above that in the single-substrate processing CVD apparatus and CVD procedure whereby a metal film for wiring purposes is deposited on a silicon substrate of this invention, one CVD process is carried out by combining a process which has excellent filling characteristics and a process which has an excellent film deposition rate. The film deposition efficiency and the film quality can be improved by realizing a high film deposition rate and good filling characteristics. Moreover, efficient filling is possible for wiring structures, and it is possible to realize an efficient method for the manufacture of semiconductor devices.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:
1. A single-substrate processing CVD procedure for depositing a metal film for wiring purposes on a substrate having a first trench, a second trench, and a via hole, wherein the second trench is narrower than the first trench and the via hole is narrower than the second trench, the procedure comprises the steps of:
   in a first CVD process, depositing a film in a first process chamber under first deposition conditions where the rate of film deposition is relatively low and the filling characteristics are good, and during the first CVD process the via hole and the second trench are completely filled and the first trench is incompletely filled; and in a second CVD process, depositing a film in a second process chamber under second film deposition conditions where the rate of film deposition is higher than under the first deposition conditions and the filling characteristics are not as good as under the first deposition conditions, and in the second CVD process, the first trench is completely filled;

wherein the first CVD process and the second CVD process are carried out sequentially to complete one film deposition procedure.

2. The single-substrate processing CVD procedure, as claimed in claim 1, in which the first CVD process and the second CVD process are both thermal CVD processes.

3. A single-substrate processing CVD procedure, as claimed in claim 2, in which a precursor used in the first and second CVD processes is a β-diketonato-copper(I) complex.

4. The single-substrate processing CVD procedure, as claimed in claim 3, in which the precursor is trimethylvinylsilyl-hexafluoroacetylacetonato-copper(I).

5. The single-substrate processing CVD procedure, as claimed in claim 2, in which the substrate temperature under the first film deposition conditions is within the range of 150 to 190° C., and the substrate temperature under the second film deposition conditions is within the range of 190 to 230° C.

6. The single-substrate processing CVD procedure, as claimed in claim 5, in which the difference between the substrate temperature under the first film deposition conditions and the substrate temperature under the second film deposition conditions is at least 5° C.

7. A single-substrate processing CVD procedure for depositing a metal film for wiring purposes on a substrate having a first trench, a second trench, and a via hole, wherein the second trench is narrower than the first trench and the via hole is narrower than the second trench, the procedure comprises the steps of:

in a first thermal CVD process, depositing a film under first deposition conditions where the rate of film deposition is relatively low and the filling characteristics are good, and during the first CVD process the via hole and the second trench are completely filled and the first trench is incompletely filled; and in a second thermal CVD process, depositing a film under second film deposition conditions where the rate of film deposition is higher than under the first deposition conditions and the filling characteristics are not as good as under the first deposition conditions, and in the second CVD process, the first trench is completely filled;

wherein the first CVD process and the second CVD process are carried out sequentially to complete one film deposition procedure; and wherein the substrate temperature under the first film deposition conditions is within the range of 150 to 190° C., and the substrate temperature under the second film deposition conditions is within the range of 190 to 230° C.

8. The single-substrate processing CVD procedure, as claimed in claim 7, in which the difference between the substrate temperature under the first film deposition conditions and the substrate temperature under the second film deposition conditions is at least 5° C.

* * * * *